US012225669B2

(12) United States Patent
Oh et al.

(10) Patent No.: US 12,225,669 B2
(45) Date of Patent: Feb. 11, 2025

(54) MANUFACTURING METHOD OF CONTINUOUS SHEET FOR CIRCUIT BOARD PRODUCTION AND CONTINUOUS SHEET FOR CIRCUIT BOARD PRODUCTION MANUFACTURED THEREFROM

(71) Applicant: LG CHEM, LTD., Seoul (KR)

(72) Inventors: Hyung Suk Oh, Daejeon (KR); Kwanghee Jung, Daejeon (KR); Chul Young Kim, Daejeon (KR); Ji Hyup Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 1114 days.

(21) Appl. No.: 16/966,766

(22) PCT Filed: Oct. 1, 2019

(86) PCT No.: PCT/KR2019/012833
§ 371 (c)(1),
(2) Date: Jul. 31, 2020

(87) PCT Pub. No.: WO2020/071735
PCT Pub. Date: Apr. 9, 2020

(65) Prior Publication Data
US 2021/0037656 A1 Feb. 4, 2021

(30) Foreign Application Priority Data
Oct. 4, 2018 (KR) .......................... 10-2018-0118512

(51) Int. Cl.
*H05K 3/00* (2006.01)
*H05K 3/02* (2006.01)

(52) U.S. Cl.
CPC .......... *H05K 3/022* (2013.01); *H05K 3/0061* (2013.01); *H05K 3/0064* (2013.01)

(58) Field of Classification Search
CPC .... H05K 3/022; H05K 3/0061; H05K 3/0064; H05K 2203/1545; H05K 1/03;
(Continued)

(56) References Cited

U.S. PATENT DOCUMENTS 3,936,548 A * 2/1976 Konicek .................. C25D 3/38
216/33
4,659,425 A 4/1987 Eggers et al.
(Continued)

FOREIGN PATENT DOCUMENTS

CN 1801541 A * 7/2006
JP H04-171792 A 6/1992
(Continued)

*Primary Examiner* — Jacob T Minskey
*Assistant Examiner* — Caroline Beha
(74) *Attorney, Agent, or Firm* — Bryan Cave Leighton Paisner LLP (57) ABSTRACT

The present disclosure relates to a manufacturing method of a continuous sheet for circuit board production providing reel type laminates in a roll-to-roll continuous process without a belt press by connecting at least two or more sheet type metal laminates using an adhesion substrate which includes a reinforcement film and a conductor, the manufacturing method providing improved mechanical properties, and excellent chemical resistance and productivity, and the continuous sheet for circuit board production manufactured therefrom.

11 Claims, 3 Drawing Sheets

(58) Field of Classification Search
CPC ........ H05K 3/02; H05K 1/0366; B32B 15/01; B32B 38/18; B32B 2457/08
See application file for complete search history.

(56) References Cited

U.S. PATENT DOCUMENTS

| | | | |
|---|---|---|---|
| 5,354,408 A | | 10/1994 | Otomine et al. |
| 5,436,062 A | * | 7/1995 | Schmidt ............... H05K 3/4084 |
| | | | 428/209 |
| 5,851,646 A | * | 12/1998 | Takahashi ............... B32B 15/14 |
| | | | 428/378 |
| 8,476,549 B2 | | 7/2013 | Nakagawa et al. |
| 2011/0233320 A1 | | 9/2011 | Hanafusa |
| 2012/0276392 A1 | | 11/2012 | Takahashi et al. |
| 2015/0044484 A1 | | 2/2015 | Ito et al. |
| 2016/0230037 A1 | | 8/2016 | Takahashi et al. |
| 2016/0234942 A1 | | 8/2016 | Takahashi et al. |
| 2018/0094162 A1 | | 4/2018 | Takahashi et al. |

FOREIGN PATENT DOCUMENTS

| | | | | |
|---|---|---|---|---|
| JP | H09142569 | A | * | 6/1997 |
| JP | 2002164639 | A | * | 6/2002 |
| JP | 2006295143 | A | | 10/2006 |
| JP | 2008231528 | A | * | 10/2008 |
| JP | 2012-025845 | A | | 2/2012 |
| JP | 2013038290 | A | | 2/2013 |
| JP | 2015-110769 | A | | 6/2015 |
| JP | 2015193703 | A | * | 11/2015 |
| JP | 2017-057254 | A | | 3/2017 |
| KR | 10-20080010302 | A | | 1/2008 |
| KR | 10-1031230 | B1 | | 4/2011 |
| KR | 20120093774 | A | * | 8/2012 |
| KR | 10-20120123031 | A | | 11/2012 |
| KR | 10-1220595 | B1 | | 1/2013 |
| KR | 10-20140138677 | A | | 12/2014 |
| KR | 10-20150030683 | A | | 3/2015 |
| TW | 201444429 | A | | 11/2014 |
| WO | 2018-116967 | A | | 6/2018 |

* cited by examiner

MANUFACTURING METHOD OF CONTINUOUS SHEET FOR CIRCUIT BOARD PRODUCTION AND CONTINUOUS SHEET FOR CIRCUIT BOARD PRODUCTION MANUFACTURED THEREFROM

CROSS-REFERENCE TO RELATED APPLICATION(S)

This application is a National Stage Entry of International Application No. PCT/KR2019/012833, filed on Oct. 1, 2019, and claims the benefit of and priority to Korean Application No. 10-2018-0118512, filed on Oct. 4, 2018, all of which are hereby incorporated by reference in their entirety for all purposes as if fully set forth herein.

TECHNICAL FIELD

The present invention relates to a manufacturing method of a continuous sheet for circuit board production and a continuous sheet for circuit board production manufactured therefrom, and more particularly to a manufacturing method of a continuous sheet for circuit board production having improved running performance and superior chemical resistance and mechanical properties over a conventional copper foil laminating process applied only to sheet types, by providing an adhesion substrate required for manufacturing a Roll copper clad laminate (hereinafter referred to as CCL) for the roll-to-roll (hereinafter referred to as RTR) process and for manufacturing the roll CCL, and a continuous sheet for circuit board production manufactured therefrom.

BACKGROUND ART

A metal laminate for circuit board production, such as a conventional copper clad laminate (hereinafter referred to as CCL), is generally manufactured by the following two methods.

The first is a method of manufacturing a sheet type CCL using impregnation and pressing. Also, the second is a method of manufacturing a CCL in a reel type using a belt press.

The problem of the first method is that it is not a continuous process during the manufacture of a printed circuit board (PCB) and thus, the productivity is lowered.

In addition, a belt press is required to manufacture the reel type CCL by the second method, but there is a disadvantage that in order to install the belt press, the initial investment cost is high.

Therefore, there is a need for the development of a new method capable of manufacturing a metal laminate for circuit board production in an inexpensive manner while ensuring productivity and basic mechanical properties.

DETAILED DESCRIPTION OF THE INVENTION

Technical Problem

It is an object of the present invention to provide a manufacturing method of a continuous sheet for circuit board production that can provide a reel type final product through a roll-to-roll continuous process even without a belt press, by connecting at least two or more sheet type metal laminates using a conductive adhesion substrate and then moving them.

It is another object of the present invention to provide a roll type CCL for circuit board production obtained according to the above method, which has improved mechanical properties and excellent chemical resistance and productivity.

Technical Solution

In one aspect of the present invention, there is provided a manufacturing method of a continuous sheet for circuit board production comprising the step of winding an adhesion substrate one or more turns around the perimeter of the adhesion surface of adjacent sheet type metal laminates, where at least two or more sheet type metal laminates are adjoined in series in the direction of a metal foil.

In another aspect of the present invention, there is provided a continuous sheet for circuit board production in which at least two or more sheet type metal laminates are adjoined in series in the direction of a metal foil, and an adhesion substrate is wound one or more turns around the perimeter of the adhesion surface of adjoined sheet type metal laminates.

Hereinafter, a manufacturing method of a continuous sheet for circuit board production according to a specific embodiment of the present invention, and a continuous sheet for circuit board production manufactured therefrom will be described in more detail.

Unless otherwise specified throughout the present specification, the technical terms used herein are only for describing specific embodiments and is not intended to limit the present invention.

The singular forms "a" and "an" are intended to include the plural forms as well, unless the context clearly indicates otherwise.

The term "including" or "comprising" used herein specifies a specific feature, region, integer, step, action, element and/or component, but does not exclude the addition of a different specific feature, area, integer, step, action, element, component and/or group.

The terms including ordinal numbers such as "a first", "a second", etc. are used only for the purpose of distinguishing one component from another component, and are not limited by ordinal numbers. For instance, a first component may be referred to as a second component, or similarly, the second component may be referred to as the first component, without departing from the scope of the present invention.

As used herein, the weight average molecular weight refers to a weight average molecular weight in terms of polystyrene measured by GPC method. In the process of measuring the weight average molecular weight in terms of polystyrene measured by GPC method, a detector and an analytical column, such as a commonly known analysis apparatus and differential refractive index detector can be used, and commonly applied temperature conditions, solvent, and flow rate can be used. Specific examples of the measurement conditions are as follows: Waters PL-GPC220 instrument equipped with Polymer Laboratories PLgel MLX-B, 300 mm column is used, an evaluation temperature is 160° C., 1,2,4-trichlorobenzene is used as a solvent, the flow rate is 1 mL/min, a sample is prepared at a concentration of 10 mg/10 mL and then fed in an amount of 200 μL, and the value of Mw can be determined using calibration curves formed from a polystyrene standard. The molecular weight of the polystyrene standards is nine kinds of 2,000/10,000/30,000/70,000/200,000/700,000/2,000,000/4,000,000/10,000,000.

In the present specification, the term 'turn' refers to a unit that counts the number of times of winding around the perimeter of the surface of an object and returning to a predetermined position in a shortest distance. For example, one turn means turning around the perimeter from a point of the surface of an object and returning once to a predetermined position in a shortest distance, 0.5 turns means turning half of the perimeter from a point of the surface of an object, and 1.5 turns means turning around the perimeter from one point of the surface of an object, passing through a starting point and further turning only half of the perimeter.

In a more specific example, when the object has a rectangular parallelepiped shape, 0.5 turns from the edge of the lower surface and one side surface mean starting at the edge of the lower surface and one side surface as a starting point, passing through the lower surface and rotating and turning up to the edge of the other side surface and the upper surface. 1.5 turns from the edge of the lower surface and one side surface mean starting at the edge of the lower surface and one side surface as a starting point, rotating and turning the lower surface, the other side surface, the upper surface, and one side surface, passing through a starting point, then again passing through the lower surface and rotating and turning up to the edge to the other side surface and the upper surface.

In particular, in the present specification, when the object has a rectangular parallelepiped shape, 0.25 turns from the edge of the lower surface and one side surface means starting at the edge of the lower surface and one side surface as a starting point, passing through the lower surface and rotating and turning up to the edge of the other side surface and the lower surface. 0.75 turns from the edge of the lower surface and one side surface means starting at the edge of the lower surface and one side surface as a starting point, passing through the lower surface and the other side surface and rotating and turning up to the edge of the one side surface and the upper surface.

In the present specification, means a unit of angle. In the present specification, the angle means a degree in which a straight line connecting the starting point from the center of gravity of the object and a straight line connecting the arrival point from the center of the object have a gap. Specifically, the value obtained by equally dividing the circumference of a circle into 360 from the center of the circle is represented by 1. For example, the center of gravity means an intersection of two diagonal lines having the longest distance, when the object has a rectangular parallelepiped shape.

The present invention relates to manufacture of a Roll CCL for the roll-to-roll (hereinafter referred to as RTR) process and the manufacture of an adhesion substrate required for manufacturing the Roll CCL. Specifically, according to the present invention, there is provided a manufacturing method of a Roll CCL for circuit board production which has superior running performance over a general sheet type CCL process and has superior chemical resistance and mechanical properties such that no breakage occurs during a circuit generation process.

In addition, the present invention provides a method for manufacturing a continuous sheet for a reel type circuit board production using a continuous roll-to-roll process even without using a belt press as in the prior art. To this end, the present invention includes a process of connecting the existing sheet type metal laminates by using an adhesion substrate to which conductivity is imparted and a reinforcement film is contained. In other words, the present invention uses sheet type CCLs but connects them with an adhesion film to apply to a roll-to-roll process.

Therefore, the present invention can solve the problem of breakage during running in the roll-to-roll process and improve the mechanical properties of the final product.

Next, the manufacture of an adhesion substrate for adhering sheet type CCLs, a method of manufacturing a continuous sheet for circuit board production using the same, and a continuous sheet for a circuit board production manufactured therefrom will be described below.

Manufacturing Method of Continuous Sheet for Circuit Board Production

According to one embodiment of the invention, there can be provided a manufacturing method of a continuous sheet for circuit board production comprising the step of winding an adhesion substrate one or more turns around the perimeter of the adhesion surface of adjoined sheet type metal laminates, in a state where at least two or more sheet type metal laminates are arranged and contacted in parallel in the direction of a metal foil.

As a result of further continuous studies, the present inventors have found a structure that can effectively prevent the liquid penetration at the edge of the adhesion surface that may occur in the wet step of the PCB process in the manufacturing method of a continuous sheet for circuit board production, and thereby, found through experiments that a manufacturing method of a Roll CCL for circuit board production having excellent chemical resistance and mechanical properties can be provided. The present invention has been completed on the basis of these findings.

Specifically, the step of winding an adhesion substrate one or more turns around the perimeter of the adhesion surface of adjoined sheet type metal laminates may include a step of winding one type of adhesion substrate 1.5 to 2.5 turns around the perimeter of the adhesion surface of adjoined sheet type metal laminates.

Moreover, the step of winding an adhesion substrate one or more turns around the perimeter of the adhesion surface of adjoined sheet type metal laminates may include a step of winding a first adhesion substrate 0.5 turns to 1.5 turns around the perimeter of the adhesion surface of the adjoined sheet type metal laminates; and a step of winding a second adhesion substrate 0.5 turns to 1.5 turns around the perimeter of the adhesion surface of the adjoined sheet type metal laminates subsequently to the first adhesion substrate.

Further, before the step of winding the adhesion substrate one or more turns around the perimeter of the adhesion surface of the adjoined sheet type metal laminates, it may include a step of providing the adhesion substrate; a step of providing at least two or more sheet type metal laminates cut into a predetermined size; and a step of placing horizontally and parallelly at least two or more sheet type metal laminates so as to be made contact with each other.

Hereinafter, the manufacturing method of the continuous sheet of the circuit board production according to the present invention will be described in detail for every step.

Adhering Sheet Type Metal Laminates Using the Adhesion Substrate

The manufacturing method of a continuous sheet for circuit board production according to the present invention may include the step of winding an adhesion substrate one or more turns around the perimeter of the adhesion surface of adjoined sheet type metal laminates, in a state where at least two or more sheet type metal laminates are arranged and contacted in parallel in the direction of a metal foil.

Specifically, since the sheet type metal laminate has a rectangular parallelepiped shape, the step of winding the adhesion substrate one or more turns around the perimeter of the adhesion surface of the adjoined sheet type metal laminates may mean a step of winding the sheet type metal laminate while folding the adhesion substrate at the edge part of the sheet type metal laminate.

In the above-mentioned method, the step of winding the adhesion substrate one or more turns around the perimeter of the adhesion surface of the adjoined sheet type metal laminates means a step of starting at the edge of the lower surface and one side surface of the sheet type metal laminate as a starting point, turning around the perimeter while rotating toward the surface of the lower surface, and winding up to the starting point.

According to one embodiment of the present invention, the step of winding the adhesion substrate one or more turns around the perimeter of the adhesion surface of adjoined sheet type metal laminates may include a step of winding one type of adhesion substrate 1.5 turns to 2.5 turns or 1.75 turns to 2.25 turns around the perimeter of the adhesion surface of adjoined sheet type metal laminates.

The step of winding one type of adhesion substrate 1.5 turns to 2.5 turns or 1.75 turns to 2.25 turns around the perimeter of the adhesion surface of the adjoined sheet type metal laminates may include a step of winding one type of adhesion substrate at 540° to 900°, or 630° to 810° around the perimeter of the adhesion surface of adjoined sheet type metal laminates.

Further, the step of winding one type of adhesion substrate 1.5 turns to 2.5 turns, or 1.75 turns to 2.25 turns around the perimeter of the adhesion surface of the adjoined sheet type metal laminates means a step of winding one type of adhesion substrate around the perimeter of the adhesion surface of the adjoined sheet type metal laminates, the step starting at the edge of the lower surface and one side surface of the sheet type metal laminate as a starting point, turning and winding around the perimeter the while rotating toward the lower surface.

That is, the step of winding one type of adhesion substrate 1.5 turns to 2.5 turns around the perimeter of the adhesion surface of mutually adjacent sheet type metal laminates may mean a step of starting at the edge of the lower surface and one side surface of the sheet type metal laminates as a starting point, turning around the perimeter while rotating toward the lower surface, passing through the starting point, setting the edge of the upper surface and the other side surface as an arrival point and starting at the edge of the lower surface and one side surface as a starting point, turning around the perimeter while rotating towards the lower surface, passing the starting point twice, and then again winding up to the upper surface which is the starting point, and the arrival point which is the edge of the other side surface.

Further, the step of winding one type of adhesion substrate with 1.75 turns to 2.25 turns around the perimeter of the adhesion surface of adjoined sheet type metal laminates may mean a step of starting at the edge of the lower surface and one side surface of the sheet type metal laminate as a starting point, turning around the perimeter while rotating toward the lower surface, passing through the starting point, setting the edge of the upper surface and one side surface as an arrival point and starting at the edge of the lower surface and one side surface as a starting point, turning around the perimeter while rotating toward the surface of the lower surface, passing through the starting point twice, and winding up to the arrival point which is the edge of the lower surface and the other side surface.

According to one embodiment of the present invention, the step of winding the adhesion substrate one or more turns around the perimeter of the adhesion surface adjoined sheet type metal laminates may include a step of winding a first adhesion substrate 0.5 turns to 1.5 turns or 0.75 turns to 1.25 turns around the perimeter of the adhesion surface of adjoined sheet type metal laminates; and a step of winding a second adhesion substrate 0.5 turns to 1.5 turns or 0.75 turns to 1.25 turns around the perimeter of the adhesion surface of adjoined sheet type metal laminates subsequently to the first adhesion substrate.

The step of winding a first adhesion substrate 0.5 turns to 1.5 turns or 0.75 turns to 1.25 turns around the perimeter of the adhesion surface adjoined sheet type metal laminates; and a step of winding a second adhesion substrate 0.5 turns to 1.5 turns or 0.75 turns to 1.25 turns around the perimeter of the adhesion surface of adjoined sheet type metal laminates subsequently to the first adhesion substrate may mean a step of winding a first adhesion substrate at 180° to 540°, or 270° to 450° around the perimeter of the adhesion surface of adjoined sheet type metal laminates; and a step of winding a second adhesion substrate at 180° to 540°, or 270° to 450° around the perimeter of the adhesion surface of adjoined sheet type metal laminates subsequently to the first adhesion substrate.

The step of winding a first adhesion substrate 0.5 turns to 1.5 turns around the perimeter of the adhesion surface of adjoined sheet type metal laminates may mean a step of winding a first adhesion substrate around the perimeter of the adhesion surface of the adjoined sheet type metal laminates, the step starting at the edge of the lower surface and one side surface of the sheet type metal laminate as a starting point and turning around the perimeter while rotating toward the surface of the lower surface.

The step of winding a first adhesion substrate 0.5 turns to 1.5 turns around the perimeter of the adhesion surface of adjoined sheet type metal laminates may mean a step of winding a first adhesion substrate around the perimeter of the adhesion surface of adjoined sheet type metal laminates, the step starting at the edge of the lower surface and one side surface of the sheet type metal laminate as a starting point, turning around the perimeter while rotating toward the lower surface, setting the edge of the upper surface and the other side surface as an arrival point and starting at the edge of the lower surface and one side surface as a starting point, turning around the perimeter while rotating towards the lower surface, passing through the starting point, and then winding up to the arrival point which is the edge of the upper surface and the other side surface.

On the other hand, after the step of winding a first adhesion substrate 0.5 turns to 1.5 turns around the perimeter of the adhesion surface of adjoined sheet type metal laminates, it may further include a step of cutting the non-adhered part of the first adhesion substrate.

In the step of winding a second adhesion substrate 0.5 turns to 1.5 turns around the perimeter of the adhesion surface of the adjoined sheet type metal laminates subsequently to the first adhesion substrate, winding the second adhesion substrate subsequent to the first adhesion substrate means starting at the cutting surface of the first adhesion substrate at the step of cutting the non-adhered part of the first adhesion substrate as a starting point and adhering the second adhesion substrate.

The method of manufacturing a continuous sheet for circuit board production according to the present invention may further include a step of forming a metal layer on the outermost part of the adhesion substrate.

In the method of applying the metal layer, after the application of the adhesion substrate is completed, a method of winding a metal layer having a predetermined thickness and width on the entire outer surface of the adhesion substrate can be applied. And, optionally, in the step of manufacturing the first adhesion substrate and the second adhesion substrate, a method of laminating a metal layer having a predetermined thickness and width separately on the outermost layer may be performed. As an example, after a metal layer is further included in the outermost layer of the second part of the first adhesion substrate, it may be used for adhesion. In addition, after a metal layer is included in the entire outermost surface layer of the second adhesion substrate, it can be used for adhesion.

The metal layer may include one or more selected from the group consisting of copper (Cu), aluminum (Al), nickel (Ni), silver (Ag), and iron (Fe). Further, the thickness of the metal layer can be 0.1 μm to 50 μm.

Further, the method of manufacturing a continuous sheet for circuit board production according to the present invention may further include a step of winding at least two or more sheet type metal laminates connected by the adhesion substrate in a horizontal direction via a guide means.

After the adhesion substrate is provided by the above method, when the adhesion substrate is applied to both sides of a part where at least two or more sheet type metal laminates come into contact, they can be easily adhered. Since the thus adhered material can be wound using a guide means, it is possible to easily provide a continuous sheet for circuit board production having excellent mechanical properties and chemical resistance.

Figure 1:
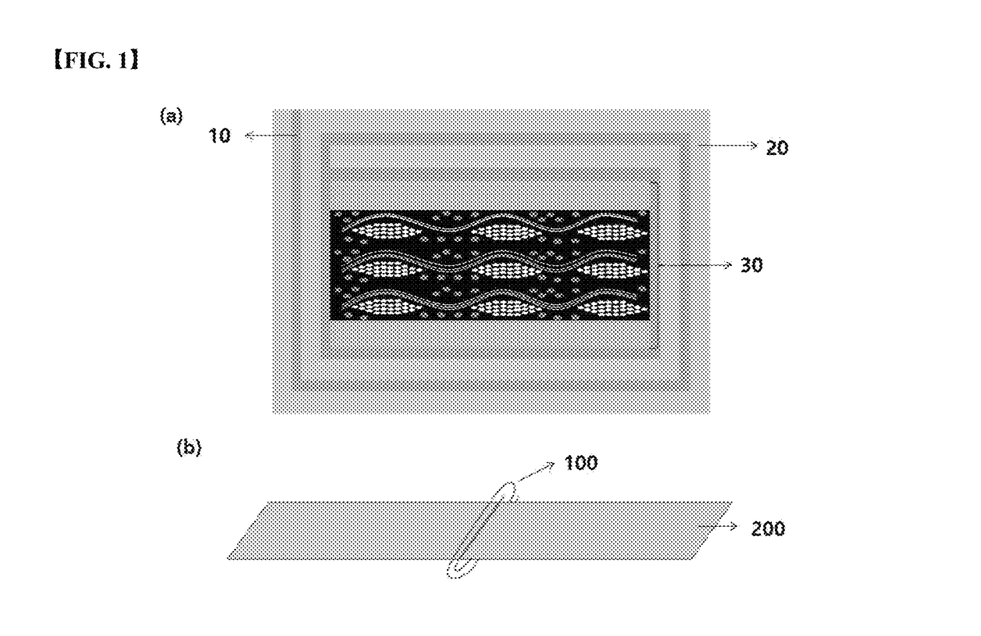
FIG. 1 schematically illustrates the structure of a continuous sheet for circuit board production to which an adhesive substrate according to Example 1 of the present invention is applied.
Figure 2:
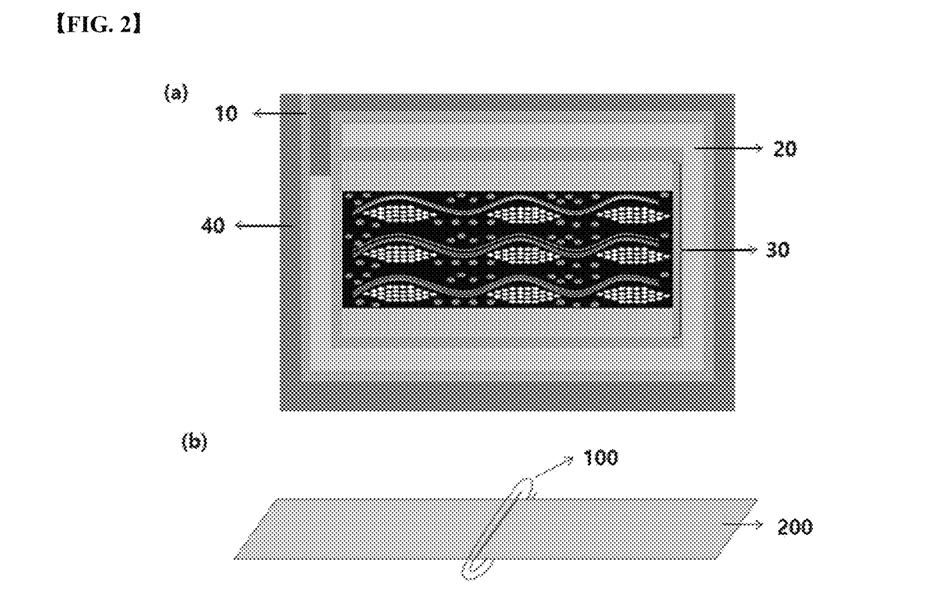
FIG. 2 schematically illustrates the structure of a continuous sheet for circuit board production to which the adhesion substrate according to Example 3 of the present invention is applied.
Figure 3:
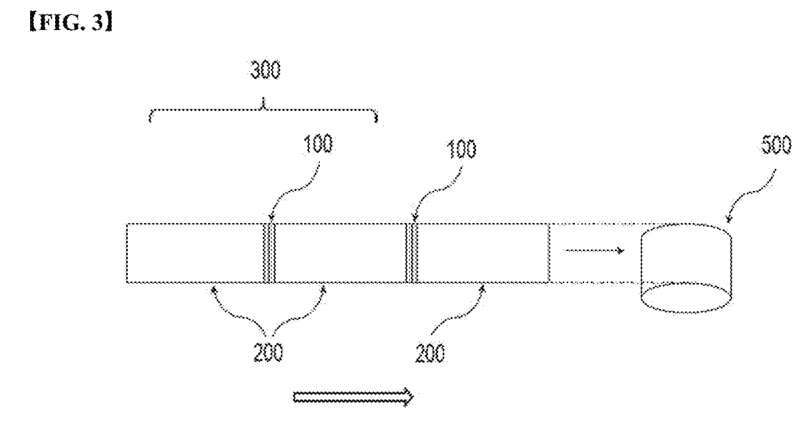
FIG. 3 schematically illustrates a form in which a continuous sheet for circuit board production of the Example is collected in a reel type.

As an example, FIG. 3 shows an example in which an adhesion substrate is applied to a sheet type metal laminate. As shown in FIG. 3, at least two or more sheet type metal laminates 200 cut into a predetermined size are arranged side by side in parallel, and the adhering parts thereof are adhered to each other using an adhesion substrate 100. Thereby, it is possible to provide the continuous sheet 300 for circuit board production to which two sheet type metal laminates are connected. The winding method of FIG. 3 corresponds to an example, and any method for winding at least two or more sheet type metal laminates connected by the adhesion substrate may be used.

At this time, since at least two or more sheet type metal laminates 200 should be connected, they are placed in parallel on the flattening device so as to be md in contact with each other. Then, through pressing, a step of adhering the entire surface of the part contacting between sheet type metal laminates by the adhesion substrate is performed.

Further, as shown in FIG. 3, when going through the above-described process, at least two or more sheet type metal laminates 200 are connected by the adhesion substrate 100. Therefore, at least two or more sheet type metal laminates 300 connected by the adhesion substrate may be wound via a guide means and a reeling means 500.

Further, the adhering part of the at least two or more sheet type metal laminates may perform adhesion between the sheet type metal laminates and the adhesion substrate via heating by applying a pressing means to the adhesion substrate.

For example, a final product of continuous sheet for circuit board production can be provided through the steps of cutting the sheet type metal laminates on a flattening device and positioning them in parallel, applying the adhesion substrate onto both side surfaces of the sheet type metal laminates, pressing the sheet type metal laminates and the adhesion substrate by using a press machine to make a long film form and then winding the film.

In the present invention, the step of winding the adhesion substrate one or more turns around the perimeter of the adhesion surface of adjoined sheet type metal laminates may include a temporary adhesion step and a main adhesion step. Through the temporary adhesion step and the main adhesion step, it is possible to ensure a high adhesive force between the adhesion substrate and the sheet type metal laminate.

That is, the step of winding the adhesion substrate one or more turns around the perimeter of the adhesion surface of adjoined sheet type metal laminates may include a step of winding the adhesion substrate along the perimeter of the adhesion surface of the adjoined sheet type metal laminates, a step of temporarily adhering the adhesion substrate, and a step of mainly adhering the adhesion substrate, and the order of these steps and the number of repetitions are not limited.

Specifically, in the temporary adhesion step, a method of applying a pressure of 0.1 kgf/cm$^2$ to 10 kgf/cm$^2$ can be used, and more preferably, the pressing may be performed in a high temperature state. Specifically, the pressing in the temporary adhesion step may be performed at 100° C. to 150° C., 100° C. to 130° C., or 100° C. to 120° C.

Specifically, for example, the temporary adhesion step includes a step of disposing an adhesion substrate on one side of a part where the sheet type metal laminates come into contact; and a step of pressing the sheet type metal laminate in the direction of the adhesion substrate. The step of disposing an adhesion substrate on one side of a part where the sheet type metal laminates come into contact can be achieved as part of the step of winding the adhesion substrate along the perimeter of the adhesion surface of adjoined sheet type metal laminates. That is, when the adhesion substrate is wound around the perimeter of one side of the adhesion surfaces of the adjoined sheet type metal laminates, the adhesion substrate may be disposed on one surface of a part where the sheet type metal laminates come into contact.

More specifically, in the step of winding the adhesion substrate around the perimeter of the adhesion surface of adjoined sheet type metal laminates, the above-described adhesion substrate may be disposed on the lower surface of the part where the sheet type metal laminates come into contact. After performing a temporary adhesion on the lower surface of the sheet type metal laminate, additional temporary adhesion can be performed on the upper surface of the sheet type metal laminate or optionally on the side surface, while continuously winding the remaining unadhered adhesion substrate around the perimeter of the surface of the sheet type metal laminate.

Through this process, the adhesion substrate of the present invention can wind the entire surface of the part where at least two or more sheet metal laminates come into contact, thereby performing the temporary adhesion.

When only one type of adhesion substrate is used, the temporary adhesion step may include the steps of positioning the one type of adhesion substrate to the lower surface of the part where the sheet type metal laminates come into contact, then pressing it at the lower surface of the sheet type metal laminate, winding one type of adhesion substrate one turn around the perimeter of all adhesion surfaces of adjoined sheet type metal laminates, and then pressing at the upper surface, further winding the adhesion substrate with one turn and pressing again at the lower and upper surfaces.

As a specific example, the first adhesion substrate is placed vertically on a temporary adhesion heating wire, and then CCLs having an insulating layer thickness of 100 μm cut into 340 mm*1030 mm (or 1250 mm) is displaced in parallel with the temporary adhesion heating wire to a width of 5 mm so that the adhesion surface between CCLs is placed on the adhesive layer of the first adhesion substrate, and then fixed. Then, the opened part at one end of the first adhesion substrate is cut in parallel with the CCL surface.

The CCL lower surface and the first adhesion substrate are temporarily adhered at a temperature of 110° C. and a pressure of 2 kgf/cm² for 2.5 to 5 seconds. Then, the remaining first adhesion substrate that is not adhered is wound one turn around the perimeter of all the adhesion surfaces between CCLs (in the order of lower→side→upper→side of the adhesion surface of CCL) and the CCL upper surface and the first adhesion substrate are temporarily adhered in the same manner.

Subsequently, while the first adhesion substrate is further wound one turn on the first adhesion substrate around the perimeter of all the adhesion surfaces between CCLs (in the order of lower→side→upper→side of the adhesion surface of CCLs), the first adhesion substrate is temporarily adhered at the lower surface of CCL in the same manner, and the first adhesion substrate is temporarily adhered even at the upper surface of CCL in the same manner. Then, the opened part of the first adhesion substrate is cut in parallel with the CCL surface.

Alternatively, when two types of adhesion substrates are used, the temporary adhesion step may include the steps of positioning a first adhesion substrate to the lower surface of the part where the sheet type metal laminates come into contact, then pressing it at the lower surface of the sheet type metal laminate, winding the first adhesion substrate 0.5 turns to 1.5 turns around the perimeter of all the adhesion surfaces of the adjoined sheet type metal laminates, and then pressing at the upper surface, then cutting the first adhesion substrate, again further winding the second adhesion substrate, winding it once more on the first adhesion substrate and then pressing again at the lower and upper surface parts.

As a specific example, the first adhesion substrate is placed vertically on a temporary adhesion heating wire, and then CCLs having an insulating layer thickness of 100 μm cut into 340 mm*1030 mm (or 1250 mm) is displaced in parallel with the temporary adhesion heating wire to a width of 5 mm so that the adhesion surface between CCLs is placed on the adhesive layer of the first adhesion substrate, and then fixed. Ten, the opened part at one end of the first adhesion substrate is cut parallel with the CCL surface.

The CCL lower surface and the first adhesion substrate are temporarily adhered at a temperature of 110° C. and a pressure of 2 kgf/cm² for 2.5 to 5 seconds. Then, the remaining first adhesion substrate that is not adhered is wound 0.9 turns around the perimeter of all the adhesion surfaces between CCLs (in the order of lower→side→upper→side of the adhesion surface of CCL) and the CCL upper surface and the first adhesion substrate are temporarily adhered in the same manner. Ten, the first adhesion substrate is cut at side surface of the CCL.

Subsequently, while the second adhesion substrate is further wound one turn on the first adhesion substrate around the perimeter of the adhesion surfaces between CCLs (in the order of side→lower→side→upper→side of the adhesion surface of CCLs), the second adhesion substrate is temporarily adhered at the lower surface of CCL in the same manner, and the second adhesion substrate is temporarily adhered even at the upper surface of CCL in the same manner. Then, the opened part of the second adhesion substrate is cut in parallel with the CCL surface.

In addition, the main adhesion step is a step in which at least two or more sheet type metal laminates achieve complete adhesion to the adhering part by secondarily pressing the adhering part to which the adhesion substrate is applied. The main adhesion step may include a step in which the adhesion substrate is pressed at a higher pressure and temperature range than the temporary adhesion step so that the adhesion substrate secondarily adheres the entire surface of the part where the laminates come into contact.

In the temporary adhesion and the main adhesion, the pressing means may use a press machine equipped with heating means, and the configuration thereof is not particularly limited. For example, the pressing means may use a vacuum hot press or a general hot press. In addition, in the present invention, the pressing may include the pressure conditions of the process of manufacturing the final continuous sheet for circuit board in the step of adhering with the adhesion substrate the entire surface of the part where the sheet type metal laminates come into contact.

The main adhesion step can be performed under the conditions of a temperature of 180° C. to 220° C., a pressure of 3.5 kgf/cm² to 12.5 kgf/cm² and a pressing time of 3 minutes to 5 minutes. When the pressing temperature at the time of the main adhesion is less than 160° C., there is a problem that the adhesive force is lowered due to uncured. Further, when the pressing temperature is more than 200° C., there is a problem that the perimeter of the adhering part is contaminated by the flow of the adhesive. Further, when the pressing pressure is less than 0.5 kgf/cm², there is a problem of non-adhesion, and when the pressing pressure is more than 13 kgf/cm², there is a problem that the thickness of the adhesive layer decreases due to the excessive flow of the adhesive and breakage occurs during winding due to the decrease in the thickness of the adhesive layer. Further, when the pressing time is less than 1 minute, there is a problem of peeling due to non-adhesion, and when the pressing time is more than 10 minutes, there is a problem that the adhesive is excessively cured and the CCL copper foil around the adhering part is damaged.

As described above, as the step of winding the adhesion substrate one or more turns around the perimeter of the adhesion surface of the adjoined sheet type metal laminates includes a step of winding one type of adhesion substrate 1.5 turns to 2.5 turns around the perimeter of the adhesion surface of the adjoined sheet type metal laminates, or includes a step of winding a first adhesion substrate 0.5 turns to 1.5 turns around the perimeter of the adhesion surface of the adjoined sheet type metal laminates; and a step of winding a second adhesion substrate 0.5 to 1.5 turns around the perimeter of the adhesion surface of the adjoined sheet type metal laminates subsequently to the first adhesion substrate, it is possible to provide a method of manufacturing a continuous sheet for circuit board production on which an adhered substrate including at least two adhesion substrate layers is formed on the sheet type metal laminate.

According to the manufacturing method of the present invention, at least two or more sheet type metal laminates may be provided as a continuous sheet for circuit board production having excellent waterproof property. In addition, the final product of the present invention can improve all functions such as electrical conductivity, mechanical properties, chemical resistance, and productivity.

When the at least two or more sheet type metal laminates are adhered by the adhesion substrate in this way, the metal laminates are connected as shown in FIG. 3. Then, the metal laminates connected in this way may be collected as a CCL for roll-type circuit board after being moved and wound in the horizontal direction, as shown in FIG. 3.

As described above, sine the present invention selectively uses an adhesion substrate having a specific configuration for at least two or more sheet metal laminates, it is possible to manufacture a continuous sheet for circuit board production in the form of a reel type CCL.

To this end, the present invention is characterized by using an adhesion substrate, but distributing a certain amount of conductive metal powder on the reinforcement film layer or the adhesive layer in the adhesion substrate. Since the adhesion substrate obtained by this method has uniform plating properties, when applied to the roll-to-roll process of the winding machine, no breakage occurs and thus excellent mechanical properties, as well as excellent chemical resistance can be secured.

In particular, in the present invention, the problems of the sheet type metal laminate and the general reel type metal laminate can be improved.

That is, since the present invention applies the adhesion substrate to at least two or more sheet type metal laminates provided by impregnation and pressing, a roll-to-roll continuous process is possible, and the disadvantages of existing sheet type metal laminates can be solved.

In addition, the present invention does not need to be equipped with the belt press used at the time of manufacture of a reel type metal laminate as in the past, it is possible to reduce the production cost.

Provision of adhesion substrate According to one embodiment of the present invention, the manufacturing method of a continuous sheet for circuit board production may, before the step of winding the adhesion substrate one or more turns around the perimeter of the adhesion surface of adjoined sheet type metal laminates, include a step of providing the adhesion substrate; a step of providing at least two or more sheet type metal laminates cut into a predetermined size; and a step of placing horizontally and parallelly at least two or more sheet type metal laminates so as to be in contact with each other.

According to the step of providing the adhered substrate, an adhesion substrate required for the manufacture of the Roll CCL may be provided.

The adhesion substrate according to an embodiment of the present invention may include at least one of 1) a reinforcement adhesion substrate including a reinforcement film layer, and an adhesive layer coated onto at least one surface of the reinforcement film layer; or 2) a conductor adhesion substrate including a conductor layer, and an adhesive layer coated onto at least one surface of the conductor layer.

Specifically, according to the first embodiment, the adhesion substrate may be one type of adhesion substrate which is any one of 1) a reinforcement adhesion substrate including a reinforcement film layer, and an adhesive layer coated onto at least one surface of the reinforcement film layer; or 2) a conductor adhesion substrate including a conductor layer, and an adhesive layer coated onto at least one surface of the conductor layer.

Further, according to the second embodiment, the adhesion substrate may be two types of adhesion substrates consisting of: a first adhesion substrate which is any one of 1) a reinforcement adhesion substrate including a reinforcement film layer, and an adhesive layer coated onto at least one surface of the reinforcement film layer; or 2) a conductor adhesion substrate including a conductor layer, and an adhesive layer coated onto at least one surface of the conductor layer, and a second adhesion substrate which is any one of 1) a reinforcement adhesion substrate including a reinforcement film layer, and an adhesive layer coated onto at least one surface of the reinforcement film layer; or 2) a conductor adhesion substrate including a conductor layer, and an adhesive layer coated onto at least one surface of the conductor layer.

Specifically, according to the second embodiment, the first adhesion substrate may be a conductor adhesion substrate including a conductor layer, and an adhesive layer coated onto at least one surface of the conductor layer, and the second adhesion substrate may be a reinforcement adhesion substrate including a reinforcement film layer, and an adhesive layer coated onto at least one surface of the reinforcement film layer.

Alternatively, according to the second embodiment, the first adhesion substrate may be a reinforcement adhesion substrate including a reinforcement film layer, and an adhesive layer coated onto at least one surface of the reinforcement film layer, and the second adhesion substrate may be a conductor adhesion substrate including a conductor layer, and an adhesive layer coated onto at least one surface of the conductor layer.

In the adhesion substrate of the above embodiment, the reinforcement film layer and the conductor layer may each be those manufactured by the same method.

And, in the reinforcement adhesion substrate, the reinforcement film layer or the conductor layer may include one or more layers. The conductor adhesion substrate may also include one or more reinforcement film layers or conductor layers. Further, a conductor layer may be further included on the reinforcement film included in the reinforcement adhesion substrate or the conductor adhesion substrate. Further, a reinforcement film may be further included on the conductor layer included in the reinforcement adhesion substrate or the conductor adhesion substrate.

According to a preferred embodiment of the present invention, the first adhesion substrate may have i) a structure of a reinforcement film layer and adhesive layer, ii) a structure of a conductor layer, and adhesive layer, or iii) a structure of a reinforcement film, conductor layer and adhesive layer. More specifically, the first adhesion substrate may have i) a structure of a Pi film and adhesive layer, ii) a structure of a Cu foil and adhesive layer, or iii) a structure of a PI film, Cu foil and adhesive layer. In addition, the second adhesion substrate may have i) a structure of a conductor layer and adhesive layer, ii) a structure of a reinforcement film layer and adhesive layer, or iii) a structure of a reinforcement film, conductor layer and adhesive layer. More specifically, the second adhesion substrate may have i) a structure of a Cu foil and adhesive layer, ii) a structure of a Pi film and adhesive layer, or iii) a structure of a Cu foil, PI film and adhesive layer.

In addition, in addition to the first and second adhesion substrates, it may further include the third to fourth adhesion substrates including at least one of 1) a reinforcement adhesion substrate including a reinforcement film layer, and an adhesive layer coated onto at least one surface of the reinforcement film layer; or 2) a conductor adhesion substrate including a conductor layer, and an adhesive layer coated onto at least one surface of the conductor layer.

The conductor layer according to one embodiment of the present invention has a thickness of 7 μm to 35 μm and may include Cu, SUS, or aluminum foil.

The reinforcement film layer according to one embodiment of the present invention has a thickness of 5 μm to 25 μm and may include one or more polymer resins selected from the group consisting of polyimide, polyethylene naphthalate, polyethylene terephthalate glycol, polycarbonate and polyphenylene sulfide.

The adhesive layer according to an embodiment of the present invention has a thickness of 1 μm to 10 μm or 8 μm to 10 μm, and may be an adhesive layer formed using a varnish containing an adhesive resin and a conductive powder in a weight ratio of 1:0.005 to 1:0.015.

The step of providing the adhesion substrate according to the present invention may include a step of preparing a reinforcement film layer or a conductor layer, a step of producing an adhesion substrate by coating a varnish containing an adhesive resin and a conductive powder on an inner surface of the reinforcement film layer or the conductor layer to form an adhesive layer.

A preferable example of the method of producing the first adhesion substrate and the second adhesion substrate is as follows.

First, the varnish containing an adhesive resin and a conductive powder is mixed with stirring to produce a conductive varnish.

Subsequently, the prepared conductive varnish is coated with a thickness of 7 to 10 μm on a reinforcing film and a conductor layer having a predetermined thickness, respectively, and then slitted to a predetermined width (7 mm to 15 mm) to make a tape form, thereby producing the first adhesion substrate and the second adhesion substrate.

As the coating method, a comma coater or a nip coater can be used.

The conductive powder may be one or more selected from the group consisting of copper (Cu), aluminum (Al), nickel (Ni), silver (Ag), and iron (Fe). Such specific conductive powder of the present invention imparts an effect of energizing electricity between the adhering parts.

On the other hand, as the conductive powder used to impart conductivity to the reinforcement film or the adhesive layer, it is preferable to use those having a particle size of 2.0 μm to 8.5 μm (D50), 9.5 μm or less (D90).

The adhesive resin has a weight average molecular weight of 33000 g/mol to 38000 g/mol and may include one or more selected from the group consisting of polyimide-based resin, epoxy-based resin, acrylic-based resin, phenoxy-based resin and polyisocyanate-based resin.

The adhesion substrate may be applied in a vertical direction to a part where the sheet type metal laminates come into contact, based on the horizontal direction of the sheet type metal laminates. Specifically, as the adhesion substrate, the above-described first adhesion substrate and second adhesion substrate can be used so that the part where the sheet type metal laminates come into contact is engaged.

Specifically, since the waterproof function must be accompanied when adhering the sheet type metal laminates, along with the first adhesion substrate, the outer layer exposed to the outside from the first adhesion substrate should also be included so as to wind the conductor layer. Therefore, the first adhesion substrate and the second adhesion substrate may be included by winding one or more turns around at least the perimeter of the surface of the sheet type metal laminate.

In a preferred example, the first adhesion substrate is primarily applied by winding one turn the part in contact with the sheet type metal laminates around the perimeter of the surface of the sheet type metal laminates, on the basis of the transverse direction where at least two or more sheet metal laminates are arranged in parallel in the direction of a metal foil. In addition, the second adhesion substrate is applied secondarily by winding one turn the surface of the first adhesion substrate around the perimeter of the surface of the first adhesion substrate subsequently to the first adhesion substrate.

Alternatively, when winding the first adhesion substrate one or less turn around the perimeter of the surface of the sheet type metal laminate, one surface of the adhering part of the sheet type metal laminates not wound by the first adhesion substrate and the surface of the first adhesion substrate may be wound by a second adhesion substrate.

While the adhering parts of at least two or more sheet type metal laminates are connected in this way, they can be completely sealed without a surface exposed to the outside to provide an excellent waterproof function. In addition, a conductive layer may be formed on the upper surface of the second adhesion substrate, thereby providing an effect of energizing electricity between the adhering parts.

On the other hand, the adhesion substrate used to connect at least two or more sheet type metal laminates preferably has a width of 3 mm to 20 mm, or 4 mm to 15 mm, or 5 mm to 10 mm. Most preferably, the adhesion substrate may have a width of 5 mm to 10 mm.

Moreover, the adhesion substrate may have a thickness of 7 μm to 25 μm.

The adhesion substrate according to the present invention may form an adhesion substrate layer on the surface of the sheet type metal laminate. Specifically, the adhesion substrate according to the present invention may form two or more adhesion substrate layers on the upper and lower surfaces of the sheet type metal laminate.

In the present invention, the adhesion substrate layer means each adhesion substrate contained in the multilayer structure in which two or more adhesion substrates, which are laminates coated with an adhesive layer on the reinforcement film layer or the conductor layer, are laminated.

The adhesion substrate layer formed on the sheet type metal laminate may be implemented according to a particular manufacturing method according to the present invention.

Provision of Sheet Type Metal Laminate

According to one embodiment of the present invention, the manufacturing method of a continuous sheet for circuit board production according to the present invention may, before the step of winding the adhesion substrate one or more turns around the perimeter of the adhesion surface of adjoined sheet type metal laminates, include a step of providing the adhesion substrate; a step of providing at least two or more sheet type metal laminates cut into a predetermined size; and a step of placing horizontally and parallelly at least two or more sheet type metal laminates so as to come into contact with each other.

The at least two or more sheet type metal laminates cut into a predetermined size may be provided by conventional impregnation and pressing methods.

The step of providing at least two or more sheet type metal laminates cut into a predetermined size may include a step of impregnating a fabric substrate into a thermosetting resin vanish and then semi-curing it to produce a prepreg, a step of laminating one or more of the prepregs; and a step of laminating a metal foil on one or both surfaces of the prepreg, followed by heating and pressing.

That is, the sheet type metal laminate according to an embodiment of the present invention can be manufactured by a method including a step of producing a prepreg by impregnating a fabric substrate into a thermosetting resin vanish and then semi-curing it, a step of laminating one or more of the prepregs, and a step of laminating a metal foil on one or both sides of the prepreg, followed by heating and pressing.

The thermosetting resin varnish may be a thermosetting resin composition containing a binder resin such as epoxy resin and a filler.

In addition, the thermosetting resin composition may further include one or more additives selected from the group consisting of a solvent, a curing accelerator, a flame retardant, a lubricant, a dispersant, a plasticizer and a silane coupling agent. Since the type and content of the binder resin, the filler and the additive may be used according to methods well known in the art, a detailed description thereof will be omitted.

The type of the fabric substrate is not particularly limited, but a glass fabric substrate, a synthetic fabric substrate made of a woven or nonwoven fabric having, as a main ingredient, a polyamide-based resin fiber, such as a polyamide resin fiber, an aromatic polyamide resin fiber, or the like, a polyester-based resin fiber such as a polyester resin fiber, an aromatic polyester resin fiber, or a wholly aromatic polyester resin fiber, a polyimide resin fiber, or a fluororesin fiber, or the like, and a paper substrate having, as a main ingredient, craft paper, cotton linter paper, or mixed paper of linter and craft pulp may be used. Among them, the glass fabric substrate may be preferably used. The glass fabric substrate may improve strength of the prepreg and decrease water absorption and a coefficient of thermal expansion of the prepreg.

The glass substrate may be selected from glass substrates used as materials for various printed circuit boards. Examples thereof may include glass fabric such as E glass, D glass, S glass, T glass, NE glass and L glass, but the present invention is not limited thereto. The glass substrate material may be selected according to the need, desired purpose, or performance. A form of the glass substrate is typically woven fabric, non-woven fabric, roving, a chopped strand mat, or a surfacing mat. A thickness of the glass substrate is not particularly limited, but a glass substrate having a thickness of about 0.01 mm to 0.3 mm, or the like may be used. Among the materials, a glass fiber material may be more preferable in view of strength and a water absorption property. Further, in the present invention, a preparation method of the prepreg is not particularly limited, and the prepreg may be prepared by a method well known in the art. For example, as the preparation method of a prepreg, an impregnation method, a coating method using various coaters, a spraying method, or the like, may be used.

In the case of the impregnation method, the prepreg may be prepared by preparing varnish and then impregnating the fabric substrate with the varnish.

The metal thin film may be one or more selected from the group consisting of copper (Cu), iron (Fe), nickel (Ni), titanium (Ti), aluminum (Al), silver (Ag), gold (Au), and alloys of two or more thereof. The metal thin film may have a thickness of 0.1 µm to 50 µm.

According to a preferred embodiment, the metal foil used in the present invention may be a copper foil or an aluminum foil, and those having a thickness of about 2 µm to 200 µm can be used, but those having a thickness of about 2 µm to 35 µm are preferred. Preferably, the metal foil is the copper foil. Further, the metal foil according to the present invention is the composite foil with a three-layer structure having nickel, nickel-phosphorus, nickel-tin alloy, nickel-iron alloy, lead or lead-tin alloy as the interlayer between a 0.5 µm to 15 µm copper layer and a 10 µm to 300 µm copper layer on either side, or the composite foil with a two-layer structure including aluminum and copper foils.

One or more of the metal laminates containing the prepreg thus produced is laminated to thereby provide a sheet type metal laminate.

Continuous Sheet for Circuit Board Production

According to another embodiment of the invention, there can be provided a manufacturing method of a continuous sheet for circuit board production in which at least two or more sheet type metal laminates are arranged and contacted in parallel in the direction of a metal foil, and the continuous sheet is formed of an adhesion substrate that is wound one or more turns around the perimeter of the adhesion surface of adjoined sheet type metal laminates.

The continuous sheet for circuit board production may form an adhesion substrate layer on the surface of the sheet type metal laminate by an adhesion substrate which is wound around the perimeter of the adhesion surface of adjoined sheet type metal laminates. Specifically, the continuous sheet for circuit board production according to the present invention may be a continuous sheet for circuit board production in which at least two adhesion substrate layers are formed on the upper and lower surfaces of the sheet type metal laminate.

In the present invention, the adhesion substrate layer means each adhesion substrate contained in the multilayer structure in which two or more adhesion substrates, which are laminates coated with an adhesive layer on the reinforcement film layer or the conductor layer, are laminated.

The adhesion substrate layer formed on the sheet type metal laminate may be implemented according to a particular manufacturing method according to the present invention.

Specifically, when using one type of adhesion substrate, two or more adhesion substrate layers made of one type of adhesion substrate may be formed on a surface of the sheet type metal laminate.

Further, when using two types of adhesion substrates, two or more adhesion substrate layers made of two types of adhesion substrates may be formed on a surface of the sheet type metal laminate.

In the adhesion substrate applied to the continuous sheet for circuit board production of the present invention, the adhesive layer may have a resistance value of 0.1 to 0.5 ohm (a).

The adhesion substrate may have a width of 3 mm to 20 mm, or 4 mm to 15 mm or 5 mm to 10 mm, and a total thickness of 7 µm to 25 µm with respect to a direction in which two or more sheet type metal laminates are arranged.

In each of the adhesive layers, the adhesive resin and the conductive powder are preferably included in a weight ratio of 1:0.005 to 1:0.015.

And, the reinforcement film layer may be manufactured with a thickness of 5 µm to 50 µm, and as the material thereof, one or more selected from the group consisting of polyimide, polyethylene naphthalate, polyethylene terephthalate glycol, polycarbonate and polyphenylene sulfide can be used.

The conductor layer is a thin film capable of conducting electricity, and can be formed to a thickness of 7 µm to 35 µm or 10 µm to 15 µm. The material of the conductor layer may include Cu, SUS, or aluminum foil.

The adhesion substrate can be wound around a part where adjoined sheet type metal laminates come into contact.

As described above, the adhesion substrate may be a first adhesion substrate and a second adhesion substrate that allow the upper and lower parts of the adhering part of the sheet type metal laminate to be engaged and wound.

The first adhesion substrate is formed by winding 0.5 turns to 1.5 turns around the perimeter of the surface of the sheet metal laminates so as to wind the upper and lower parts of the adhering part of the sheet type metal laminates and may include a conductor layer, and an adhesive layer coated onto at least one surface of the conductor layer.

The second adhesion substrate is formed by winding 0.5 turns to 1.5 turns around the perimeter of the surface of the first adhesion substrates which wind the upper and lower parts of the adhering part of the sheet type metal laminates and may include a reinforcement film layer, and an adhesive layer coated onto at least one surface of the reinforcement film layer.

At least two or more sheet type metal laminates used in the one embodiment may include a polymer resin layer and a metal thin film as described above.

Therefore, both sides of the adhering part of adjoined sheet type metal laminates include a metal layer of the sheet type metal laminate.

Specifically, a thermosetting polymer resin layer may be included on one side or both sides of the metal thin film.

The thermosetting polymer resin layer may include a general-purpose thermosetting resin used for the production of a copper clad laminate, and the type thereof is not particularly limited. For example, the thermosetting resin may include one or more selected from the group consisting of polyimide-based resin, epoxy-based resin, acrylic-based resin, phenoxy-based resin and polyisocyanate-based resin having a weight average molecular weight of 33000 g/mol to 38000 g/mol.

The polymer resin layer may have a thickness in the range of 0.1 μm to 100 μm or 1 μm to 50 μm.

The metal thin film may be one or more selected from the group consisting of copper, iron, nickel, titanium, aluminum, silver, gold, and alloys of two or more thereof.

The metal thin film may have a thickness of 0.1 m to 50 μm.

In addition, at least two or more sheet type metal laminates of the present invention may include one metal thin film and may include two metal thin films facing each other as necessary. When two metal thin films are included in the sheet type metal laminates, the polymer resin layer may be positioned between the two metal thin films facing each other.

Further, the at least two or more sheet type metal laminates described above may further include a polymer resin layer formed on at least one surface of the polymer resin layer. In this case, the polymer resin layer may basically have the same or different thickness as the polymer resin layer contained, and may have a thickness in the range of 0.1 μm to 100 μm, or 1 μm to 50 μm.

In addition, according to one embodiment of the present invention, a configuration in which a metal layer is additionally wound around the outermost of the adhesion substrate may be included. Therefore, the outermost part of the adhesion substrate applied to the adhering part of the sheet type metal laminates may further include a metal layer.

The metal layer may include one or more selected from the group consisting of copper, aluminum, nickel, silver (Ag), and iron. In addition, the metal layer may have a thickness of 0.1 μm to 50 μm.

The adhesion substrate may have a width of 3 mm to 20 mm, or 4 mm to 15 mm or 5 mm to 10 mm, and a total thickness of 7 μm to 25 μm with respect to a direction in which two or more sheet type metal laminates are arranged.

And, the thickness of the adhesive layer may be 1 μm to 10 μm or 8 μm to 10 μm, respectively.

In each of the adhesive layers, the adhesive resin and the conductive powder are preferably included in a weight ratio of 1:0.005 to 1:0.015.

The adhesive resin may include one or more selected from the group consisting of polyimide-based resin, epoxy-based resin, acrylic-based resin, phenoxy-based resin and polyisocyanate-based resin, having a weight average molecular weight of 33000 g/mol to 38000 g/mol.

On the other hand, as the conductive powder used to impart conductivity to the reinforcement film or the adhesive layer, it is preferable to use those having a particle size of 2.0 μm to 8.5 μm (D50), 9.5 μm or less (D90).

The conductive powder may be one or more selected from the group consisting of copper (Cu), aluminum (Al), nickel (Ni), silver (Ag), and iron (Fe). Such specific conductive powder of the present invention imparts an effect of energizing electricity between the adhering parts.

And, the reinforcement film layer may be manufactured with a thickness of 5 μm to 50 μm, and as the material thereof, one or more selected from the group consisting of polyimide, polyethylene naphthalate, polyethylene terephthalate glycol, polycarbonate and polyphenylene sulfide can be used.

The conductor layer is a thin film capable of conducting electricity, and can be formed to a thickness of 7 μm to 35 μm or 10 μm to 15 μm. The material of the conductor layer may include Cu, SUS, or aluminum foil.

The continuous sheet for circuit board production of one embodiment of the present invention as described above can secure both mechanical and chemical properties and can also provide an excellent coefficient of thermal expansion.

The final product thus produced can be used for the manufacture of double-sided or multilayer printed circuit boards. That is, the present invention can manufacture a double-sided or multilayer printed circuit board by circuit processing the continuous sheet for circuit board production. For the circuit processing, a method performed in a manufacturing process of a general double-sided or multilayer printed circuit board can be applied.

Advantageous Effects

According to the present invention, by connecting a conventional sheet type metal laminate by an adhesion substrate with improved plating properties, the mechanical properties are reinforced and also the chemical resistance of the chemicals during the PCB process is excellent, and a continuous sheet for circuit board production, which is a reel type metal laminate, can be provided by an economical method.

DETAILED DESCRIPTION OF THE EMBODIMENTS

Hereinafter, the present invention is described in further detail with reference to examples. However, these examples are for illustrative purposes only and are not intended to limit the scope of the present invention.

PREPARATION EXAMPLE

Preparation Example 1: First Adhesion Substrate (Cu Foil Substrate)

1) Preparation of Conductive Adhesive Varnish

A conductive varnish was prepared by mixing 100% by weight of a general-purpose polyimide-based resin and 1% by weight of Cu powder (4 to 4.5 μm based on the particle size D50) as a conductive metal powder with stirring.

2) Preparation of Adhesion Substrate

The conductive varnish prepared in 1) was coated onto a copper foil, which is a conductor layer having a thickness of 12 μm, using a comma coater, and then coated to a thickness of 10 μm to form an adhesive layer, and then slitted to a predetermined width (10 mm) to make a tape form.

Preparation Example 2: Second Adhesion Substrate (PI Substrate)

1) Preparation of Conductive Adhesive Varnish

A conductive varnish was prepared by mixing 100% by weight of a general-purpose polyimide resin and 1% by weight of Cu powder (4 to 4.5 μm based on the particle size D50) as a conductive metal powder with stirring.

2) Preparation of Adhesion Substrate

The conductive varnish prepared in 1) was coated onto a polyimide film (SK Kolon PI, ½ mil) which is a reinforcement film layer having a thickness of 12 μm, using a comma coater, and then coated to a thickness of 10 μm to form an adhesive layer, and then slitted to a predetermined width (10 mm) to make a tape form.

Example 1

The first adhesion substrate obtained in Preparation Example 1 was placed vertically on a temporary adhesion heating wire, and then CCLs having an insulating layer thickness of 100 μm cut into 340 mm*1030 mm (or 1250 mm) was displaced in parallel with the temporary adhesion heating wire to a width of 5 mm so that the adhesion surface between CCLs was placed on the adhesive layer of the first adhesion substrate, and then fixed. Then, the opened part at one end of the first adhesion substrate was cut in parallel with the CCL surface.

The CCL lower surface and the first adhesion substrate were temporarily adhered at a temperature of 110° C. and a pressure of 2 kgf/cm² for 2.5 to 5 seconds. Then, the remaining first adhesion substrate that was not adhered was wound one turn around the perimeter of all the adhesion surfaces between CCLs (in the order of lower→side→upper→side of the adhesion surface of CCL) and the CCL upper surface and the first adhesion substrate were temporarily adhered in the same manner.

Subsequently, while the first adhesion substrate was further wound one turn on the first adhesion substrate around the perimeter of all the adhesion surfaces between CCLs (in the order of lower→side→upper→side of the adhesion surface of CCLs), the first adhesion substrate was temporarily adhered at the lower surface of CCL in the same manner, and the first adhesion substrate was temporarily adhered even at the upper surface of CCL in the same manner. Then, the opened part of the first adhesion substrate was cut in parallel with the CCL surface.

Then, it was pressed at a temperature of 180° C. to 220° C. and a pressure of 6.5 to 12.5 kgf/cm² for 1 to 5 minutes using a vacuum hot press. The end of the adhered CCL was fixed using a nip bar and then wound on a winding roll by transferring the unit length using a linear servo. (Tension 150-500 N).

Through the above process, a continuous sheet for circuit board production was manufactured.

Example 2

A continuous sheet for circuit board production was manufactured in the same manner as in Example 1, except that the second adhesion substrate of Preparation Example 2 was used instead of the first adhesion substrate of Preparation Example 1.

Example 3

The first adhesion substrate obtained in Preparation Example 1 was placed vertically on a temporary adhesion heating wire, and then CCLs having an insulating layer thickness of 100 μm cut into 340 mm*1030 mm (or 1250 mm) was displaced in parallel with the temporary adhesion heating wire to a width of 5 mm so that the adhesion surface between CCLs was placed on the adhesive layer of the first adhesion substrate, and then fixed. Then, the opened part at one end of the first adhesion substrate was cut in parallel with the CCL surface.

The CCL lower surface and the first adhesion substrate were temporarily adhered at a temperature of 110° C. and a pressure of 2 kgf/cm² for 2.5 to 5 seconds. Then, the remaining first adhesion substrate that was not adhered was wound 0.9 turns around the perimeter of all the adhesion surfaces between CCLs (in the order of lower→side→upper→side of the adhesion surface of CCL) and the CCL upper surface and the first adhesion substrate were temporarily adhered in the same manner. Then, the first adhesion substrate was cut from the open side of the CCL.

Subsequently, while the second adhesion substrate obtained in Preparation Example 2 was wound 1.1 turns on the first adhesion substrate around the entire perimeter of the adhesion surfaces between CCLs (in the order of side→lower→side→upper→side of the adhesion surface of CCLs) from the cutting surface, the second adhesion substrate was temporarily adhered at the lower surface of CCL in the same manner, and the second adhesion substrate was temporarily adhered even at the upper surface of CCL in the same manner. Then, the opened part of the second adhesion substrate was cut in parallel with the CCL surface.

Then, it was pressed at a temperature of 180° C. to 220° C. and a pressure of 3.5 to 12.5 kgf/cm² for 1 to 5 minutes using a vacuum hot press. The end of the adhered CCL was fixed using a nip bar and then wound on a winding roll by transferring the unit length using a linear servo. (Tension 150-500 N).

Through the above process, a continuous sheet for circuit board production was manufactured.

Example 4

A continuous sheet for circuit board production was manufactured in the same manner as in Example 3, except that the second adhesion substrate of Preparation Example 2 was used instead of the first adhesion substrate of Preparation Example 1 and the first adhesion substrate of Preparation Example 1 was used instead of the second adhesion substrate of Preparation Example 2.

EXPERIMENTAL EXAMPLE

In Examples 1 to 4, the alkali resistance and acid resistance of the adhesion substrate part were tested, and the results are shown in Table 1 below.

TABLE 1

| | Category | Drug name | Test condition | Result |
|---|---|---|---|---|
| Example 1 | Alkali resistance | NaOH | 10 wt %, 80° C., 10 min immersion | Highest |
| | | | 25 wt %, 80° C., 5 min immersion | Highest |
| | | $NaClO_3$ | 10 wt %, 80° C., 10 min immersion | Highest |
| | | | 20 wt %, 80° C., 5 min immersion | Highest |
| | Acid resistance | HCl | 35 wt %, 25° C., 10 min immersion | Highest |
| | | | 35 wt %, 50° C., 5 min immersion | Highest |
| Example 2 | Alkali resistance | NaOH | 10 wt %, 80° C., 10 min immersion | Good |
| | | | 25 wt %, 80° C., 5 min immersion | Bad |
| | | $NaClO_3$ | 10 wt %, 80° C., 10 min immersion | Excellent |
| | | | 20 wt %, 80° C., 5 min immersion | Excellent |
| | Acid resistance | HCl | 35 wt %, 25° C., 10 min immersion | Highest |
| | | | 35 wt %, 50° C., 5 min immersion | Highest |
| | | $H_2SO_4$ | 60 wt %, 25° C., 5 min immersion | Highest |
| Example 3 | Alkali resistance | NaOH | 10 wt %, 80° C., 10 min immersion | Excellent |
| | | | 25 wt %, 80° C., 5 min immersion | Excellent |
| | | $NaClO_3$ | 10 wt %, 80° C., 10 min immersion | Highest |
| | | | 20 wt %, 80° C., 5 min immersion | Highest |
| | Acid resistance | HCl | 35 wt %, 25° C., 10 min immersion | Highest |
| | | | 35 wt %, 50° C., 5 min immersion | Highest |
| | | $H_2SO_4$ | 60 wt %, 25° C., 5 min immersion | Highest |
| Example 4 | Alkali resistance | NaOH | 10 wt %, 80° C., 10 min immersion | Good |
| | | | 25 wt %, 80° C., 5 min immersion | Bad |
| | | $NaClO^3$ | 10 wt %, 80° C., 10 min immersion | Excellent |
| | | | 20 wt %, 80° C., 5 min immersion | Excellent |
| | Acid resistance | HCl | 35 wt %, 25° C., 10 min immersion | Highest |
| | | | 35 wt %, 50° C., 5 min immersion | Highest |
| | | $H_2SO_4$ | 60 wt %, 25° C., 5 min immersion | Highest |

It was confirmed that the adhering part of the continuous sheet according to Examples of the present invention was excellent in alkali resistance and acid resistance and thus can be usefully used in the process without breakage when manufacturing a circuit board.

EXPLANATION OF SYMBOLS

10: adhesive layer
20: conductor layer
30: CCL cross section
40: reinforcement film layer
100: adhesion substrate
200: sheet type metal laminate
300: continuous sheet for circuit board production
500: reeling means

The invention claimed is:

1. A manufacturing method of a continuous sheet for circuit board production comprising:
   providing at least two or more sheet type metal laminates, each of which including a metal foil, adjoined in series in a length direction of the metal foil, and
   winding an adhesion substrate one or more turns around a perimeter of an adjoining portion of the adjoined sheet type metal laminates,
   wherein the adhesion substrate includes a first adhesion substrate and a second adhesion substrate,
   wherein the step of winding an adhesion substrate includes:
   winding the first adhesion substrate 0.5 turns to 1.5 turns around the perimeter of the adjoining portion of the adjoined sheet type metal laminates; and
   winding the second adhesion substrate 0.5 turns to 1.5 turns around the perimeter of the adjoining portion of the adjoined sheet type metal laminates, around which the first adhesion substrate has been wound, subsequently to the first adhesion substrate.

2. The manufacturing method of a continuous sheet for circuit board production according to claim 1,
   wherein the first and second adhesion substrates are:
   1) A reinforcement adhesion substrate including a reinforcement film layer, and an adhesive layer coated onto at least one surface of the reinforcement film layer; and
   2) a conductor adhesion substrate including a conductor layer, and an adhesive layer coated onto at least one surface of the conductor layer,
   or vice versa.

3. The manufacturing method of a continuous sheet for circuit board production according to claim 2,
   wherein the conductor layer has a thickness of 7 µm to 35 µm and includes copper, steel use stainless, or aluminum foil.

4. The manufacturing method of a continuous sheet for circuit board production according to claim 2,
   wherein the reinforcement film layer has a thickness of 5 µm to 25 µm and includes one or more polymer resins selected from the group consisting of polyimide, polyethylene naphthalate, polyethylene terephthalate glycol, polycarbonate and polyphenylene sulfide.

5. The manufacturing method of a continuous sheet for circuit board production according to claim 2,
   wherein the adhesive layer has a thickness of 1 µm to 10 µm and is formed using a varnish containing an adhesive resin and a conductive powder in a weight ratio of 1:0.005 to 1:0.015.

6. The manufacturing method of a continuous sheet for circuit board production according to claim 5,
   wherein the conductive powder includes one or more selected from the group consisting of copper, aluminum, nickel, silver, and iron.

7. The manufacturing method of a continuous sheet for circuit board production according to claim 5, wherein the adhesive resin includes one or more selected from the group consisting of polyimide-based resin, epoxy-based resin, acrylic-based resin, phenoxy-based resin and polyisocyanate-based resin, having a weight average molecular weight of 33000 g/mol to 38000 g/mol.

8. The manufacturing method of a continuous sheet for circuit board production according to claim 1, further comprising a step of forming a metal layer on the outermost part of the adhesion substrate.

9. The manufacturing method of a continuous sheet for circuit board production according to claim 1, wherein the sheet type metal laminate is manufactured by a method comprising:
producing a prepreg by impregnating a fabric substrate into a thermosetting resin vanish and then semi-curing the thermosetting resin vanish,
laminating one or more of the prepregs, and
laminating a metal foil on one or both sides of the prepreg, followed by heating and pressing.

10. The manufacturing method of a continuous sheet for circuit board production according to claim 1, further comprising a step of winding at least two or more sheet type metal laminates connected by the adhesion substrate in a horizontal direction via a guide means.

11. The manufacturing method of a continuous sheet for circuit board production according to claim 1, wherein the step of providing at least two or more sheet type metal laminates comprises:
providing the at least two or more sheet type metal laminates cut into a predetermined size; and
placing the at least two or more sheet type metal laminates horizontally and so as to be in contact with each other.

* * * * *